(12) United States Patent
Ding et al.

(10) Patent No.: US 10,175,797 B2
(45) Date of Patent: Jan. 8, 2019

(54) ARRAY SUBSTRATE FOR OLED DISPLAY PANEL, METHOD FOR DRIVING THE SAME, AND OLED DISPLAY PANEL AND DISPLAY APPARATUS HAVING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Lei Wang, Beijing (CN); Xiaochuan Chen, Beijing (CN); Tao Ren, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 126 days.

(21) Appl. No.: 15/305,245

(22) PCT Filed: Sep. 11, 2015

(86) PCT No.: PCT/CN2015/089434
§ 371 (c)(1),
(2) Date: Oct. 19, 2016

(87) PCT Pub. No.: WO2017/041290
PCT Pub. Date: Mar. 16, 2017

(65) Prior Publication Data
US 2017/0269745 A1    Sep. 21, 2017

(51) Int. Cl.
*G06F 3/041* (2006.01)
*G06F 3/044* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ...... G06F 3/0412; G06F 3/044; G06F 3/0416; H01L 27/3276; H01L 27/322; H01L 27/323; H01L 51/5221
See application file for complete search history.

(56) References Cited

U.S. PATENT DOCUMENTS

2012/0249401 A1* 10/2012 Omoto ................. G06F 3/0412
345/80
2013/0293499 A1* 11/2013 Chang .................... G06F 3/041
345/173
(Continued)

FOREIGN PATENT DOCUMENTS

| CN | 101876866 A | 11/2010 |
|---|---|---|
| CN | 104375305 A | 2/2015 |

(Continued)

OTHER PUBLICATIONS

The World Intellectual Property Organization (WIPO) International Search Report for PCT/CN2015/089434 dated Jun. 3, 2016 p. 1-5.

*Primary Examiner* — Ryan A Lubit
(74) *Attorney, Agent, or Firm* — Anova Law Group, PLLC (57) ABSTRACT

The present disclosure provides an array substrate for an organic light-emitting diode (OLED) display panel. The array substrate includes a substrate, a thin film transistor (TFT) layer comprising a plurality of TFTs, and an anode
(Continued)

layer comprising a plurality of anode electrodes. The array substrate also includes an organic layer comprising a plurality of organic units corresponding to anode electrodes, and a cathode layer comprising a plurality of touch electrodes for a time-sharing operation. Each touch electrode corresponds to a portion of the plurality of organic units, the plurality of the touch electrodes being arranged to be applied with a normal cathode voltage in a displaying period and to be applied with a touch cathode voltage in a touch-sensing period.

16 Claims, 9 Drawing Sheets

(51) Int. Cl.
   *H01L 27/32* (2006.01)
   *H01L 51/52* (2006.01)
   *G02F 1/1333* (2006.01)
(52) U.S. Cl.
   CPC .......... *G06F 3/0416* (2013.01); *H01L 27/322* (2013.01); *H01L 27/323* (2013.01); *H01L 27/3276* (2013.01); *H01L 51/5221* (2013.01)

(56) References Cited

U.S. PATENT DOCUMENTS

| | | | |
|---|---|---|---|
| 2014/0225838 A1* | 8/2014 | Gupta | G06F 3/0412 345/173 |
| 2015/0194470 A1* | 7/2015 | Hwang | G06F 3/044 345/173 |
| 2016/0149164 A1* | 5/2016 | Lee | H01L 51/5281 257/40 |
| 2016/0349899 A1* | 12/2016 | Hwang | G06F 3/0416 |
| 2017/0090644 A1* | 3/2017 | Yao | G06F 3/0416 |
| 2017/0123541 A1* | 5/2017 | Omata | G06F 3/044 |

FOREIGN PATENT DOCUMENTS

| | | |
|---|---|---|
| CN | 104881179 A | 9/2015 |
| CN | 104898887 A | 9/2015 |
| CN | 104898888 A | 9/2015 |
| CN | 104991683 A | 10/2015 |
| CN | 105094491 A | 11/2015 |
| KR | 20140039470 | 4/2014 |

* cited by examiner

ARRAY SUBSTRATE FOR OLED DISPLAY PANEL, METHOD FOR DRIVING THE SAME, AND OLED DISPLAY PANEL AND DISPLAY APPARATUS HAVING THE SAME

This application is a national phase entry under 35 U.S.C. § 371 of International Application No. PCT/CN2015/089434, filed on Sep. 11, 2015. The above enumerated patent application is incorporated by reference herein.

FIELD OF THE INVENTION

The present invention generally relates to the display technologies and, more particularly, relates to an array substrate for capacitive in-cell touch panel, a method for driving the array substrate, related display panels, and related display apparatus.

BACKGROUND

In an OLED device, the conductive organic layer for emitting light is often positioned between two electrode layers (i.e., the cathode layer and the anode layer) to form a "sandwich" shaped structure. In such an OLED device, holes are injected into the organic layer from the anode and electrons are injected into the organic layer from the cathode. Holes move toward electrons and combine with electrons in the organic layer to form excitons, i.e., a bound state of electron and hole. The decay of the excitons results in relaxation of energy, accompanied by emission of radiation, e.g., visible light. Compared to conventional liquid crystal display (LCD) devices, OLED display devices do not require backlight. They are also relatively thin and light, and often have a wide viewing angle and short response time. In addition, OLED display devices generally have higher light emission efficiencies.

Meanwhile, white light OLED has been used in the OLED devices for their simple operation mechanism and voltage for cost reduction. By incorporating color filters (CF) with white light OLEDs, three primary colors, i.e., red, green, and blue can be realized. In such display panels or devices, the white light OLEDs can be used to adjust the grayscale of the units in a display panel, and the lifetimes of the OLEDs for displaying the primary colors (i.e., red, green, and blue) are the same so that color distortion caused by different lifetimes of OLEDs with different colors can be reduced.

In existing touch screen devices, parasitic capacitance may thus be formed between the cathode layer and the anode voltage lines. The parasitic capacitance may slow down the response of the touch screen to the touch motion. A touch motion may often cause the cathode voltage at or near the touch location to change and further cause the electric current flowing through the OLEDs at or near the touch location to fluctuate. As a result, the touch motion may adversely affect the display brightness or display quality of the touch screen. Also, mutual capacitance may be formed between signal lines.

BRIEF SUMMARY OF THE DISCLOSURE

The present disclosure provides an array substrate. The Array substrate includes a cathode layer with a novel pattern and a novel signal line layout. By using the structure, parasitic capacitance between the cathode and the touch anode voltage lines may be reduced. Display performance such as display brightness may be more stable during touch motions.

One aspect of the present disclosure includes an array substrate for an organic light-emitting diode (OLED) display panel. The array substrate includes a substrate, a thin film transistor (TFT) layer comprising a plurality of TFTs, and an anode layer comprising a plurality of anode electrodes. The array substrate also includes an organic layer comprising a plurality of organic units corresponding to anode electrodes, and a cathode layer comprising a plurality of touch electrodes for a time-sharing operation. Each touch electrode corresponds to a portion of the plurality of organic units, the plurality of the touch electrodes being arranged to be applied with a normal cathode voltage in a displaying period and to be applied with a touch cathode voltage in a touch-sensing period.

Optionally, the cathode layer further includes a plurality of normal cathode electrodes corresponding to a plurality of organic units, the normal cathode voltage being applied on the plurality of normal cathode electrodes.

Optionally, the array substrate includes at least one displaying period and at least one touch-sensing period are included in one frame, wherein the array substrate is operated in the displaying period for displaying images; and the array substrate is operated in the touch-sensing period for displaying images and sensing touch motions.

Optionally, an integrated circuit (IC) is connected to the touch cathode lines and the TFT layer, the IC being configured to combine a wave-shaped driving signal with the normal cathode voltage to generate the touch cathode voltage and combines the wave-shaped driving signal with the normal anode voltage to generate the touch anode voltage.

Optionally, the touch electrodes are aligned in columns, each touch electrodes being connected to a touch cathode line insulated to one another and aligned along a first direction.

Optionally, the normal cathode electrodes are aligned in strips, each normal cathode electrodes being connected to a normal cathode line.

Optionally, in the displaying period of the time-sharing operation, a normal anode voltage is applied on anode electrodes of organic units corresponding to the touch electrodes, and the normal cathode voltage is applied on the touch electrodes by the touch cathode voltage lines.

Optionally, in the touch-sensing period of the time-sharing operation, a normal anode voltage is applied on anode electrodes of OLEDs corresponding to the touch electrodes, and the touch cathode voltage is applied on the touch electrodes by the touch cathode voltage lines.

Optionally, in the touch-sensing period of the time-sharing operation, a touch anode voltage is applied on anode electrodes of organic units corresponding to the touch electrodes, and the touch cathode voltage is applied on the touch electrodes by the touch cathode voltage lines, the touch cathode voltage and the touch anode voltage being wave-shaped voltages.

Optionally, the IC superimposes the wave-shaped driving signal with the normal cathode voltage to generate the touch cathode voltage; and the IC superimposes the wave-shaped driving signal with the normal anode voltage to generate the touch anode voltage.

Optionally, in the time-sharing operation, the normal anode voltage is applied on the anode electrodes of organic units corresponding to the normal cathode electrodes, and the normal cathode voltage is applied on the normal cathode electrodes.

Optionally, the touch cathode voltage and the touch anode voltage have same frequencies.

Optionally, the touch anode voltage and the touch cathode voltage are square-wave signals.

Optionally, each touch electrode has a squared shape or a rectangular shape.

Another aspect of the present disclosure includes a method for driving an array substrate with a substrate, a thin film transistor (TFT) layer with a plurality of TFTs, an anode layer with a plurality of anode electrodes each corresponding to at least an organic unit, a plurality of organic units, and a cathode layer with a plurality of touch electrodes for a time-sharing operation, each touch electrode being corresponding to a portion of the plurality of organic units. The method includes applying a normal cathode voltage on the touch electrodes in a displaying period of the time-sharing operation; and applying a touch cathode voltage on the touch electrodes in a touch-sensing period of the time-sharing operation. The normal cathode voltage has a constant voltage value and the touch cathode is a wave-shaped voltage.

Optionally, the cathode layer further includes a plurality of normal cathode electrodes corresponding to a plurality of organic units and the normal cathode voltage is applied on the plurality of normal cathode electrodes.

Optionally, the method includes at least one displaying period and at least one touch-sensing period are included in one frame, wherein operating the array substrate in the displaying period for displaying images; and operating the array substrate in the touch-sensing period for displaying images and sensing touch motions.

Optionally, in the displaying period of the time-sharing operation, a normal anode voltage is applied on anode electrodes of organic units corresponding to the touch electrodes, and applying the normal cathode voltage on the touch electrodes by the touch cathode voltage lines.

Optionally, in the touch-sensing period of the time-sharing operation, a normal anode voltage is applied on anode electrodes of OLEDs corresponding to the touch electrodes, and applying the touch cathode voltage on the touch electrodes by the touch cathode voltage lines.

Optionally, in the touch-sensing period of the time-sharing operation, a touch anode voltage is applied on anode electrodes of organic units corresponding to the touch electrodes, and applying the touch cathode voltage on the touch electrodes by the touch cathode voltage lines, the touch cathode voltage and the touch anode voltage being wave-shaped voltages with same frequencies.

Optionally, the touch electrodes are arranged in columns; and the touch cathode voltage is applied on each column of the touch electrodes based on a scanning sequence and the touch anode voltage is applied on the anode electrodes of the organic units corresponding to the touch electrodes based on a same scanning sequence.

Another aspect of the present disclosure includes a display panel, including the disclosed array substrate.

Optionally, the display panel further includes touch receiving lines distributed on a color filter substrate along a second direction for sensing touch motions, the touch receiving lines being insulated to the normal cathode electrodes, the second direction being perpendicular to the first direction, and the orthographic projections of touch receive lines not being overlapped with the touch cathode voltage lines.

Another aspect of the present disclosure provides a display apparatus, including the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides an array substrate for a capacitive in-cell touch panel.

Figure 1:
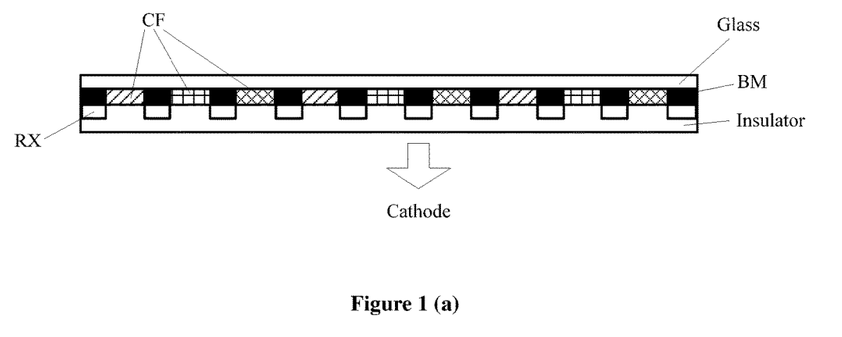
FIG. 1(a) illustrates an exemplary color filter (CF) array according to the disclosed embodiments of the present disclosure.
FIG. 1(b) illustrates an exemplary array substrate according to the disclosed embodiments of the present disclosure.

FIG. 1 illustrates the structure of an array substrate for a capacitive in-cell touch panel. For illustrative purposes, the array substrate may be viewed in two separate parts, i.e., a CF substrate and the OLEDs corresponding to the CF substrate. It should be noted that in practice, the CF substrate and the OLEDs are connected as a whole. The array substrate may further include a thin-film transistor (TFT) layer (not shown). Each OLED may be connected to at least one TFT in the TFT layer such that the at least one TFT may control the light emission, current flowing through the OLED, and other related operations of the OLED. The array substrate may further include an integrated circuit (IC). The IC may be connected to TFT layer to control the signal inputs and/or outputs, power supply to the OLEDs, and other related operations of the TFTs.

FIG. 1(a) illustrates an exemplary color filter (CF) substrate. FIG. 1(b) illustrates an exemplary OLED in an array substrate. The CF filter may be formed separately and attached to the array substrate to form a display panel. The CF substrate may cover a plurality of OLEDs in the array substrate. The CF substrate may be attached or bonded on the cathode of the array substrate. The cathode in FIG. 1(a) may be the cathode in FIG. 1(b).

In a display panel with white light OLEDs, color filters (CFs), often implemented in a CF substrate, may be used to enable a white light OLED or white light OLEDs to emit light of the three primary colors (i.e., red, green, and blue)

such that each sub-pixel, being a portion of or an entire OLED, may emit light of one primary color. Each pixel, formed by an OLED or a plurality of OLEDs, may emit light with various colors by combining the light from the sub-pixels.

FIG. 1(a) illustrates a cross-section view of an exemplary CF substrate. CFs may be formed on the glass substrate and two adjacent CFs may be separated by a distance. A portion of a black matrix BM may be formed between adjacent CFs. A touch receiving line RXs may be formed on each portion of the BM, being parallel to each other. Each two adjacent RXs may be separated by a certain space, and the space may correspond to the position of a CF. An insulator layer may be formed on the CFs. The CF substrate may be bonded or attached to the array substrate. A user may be facing the glass substrate to watch the displayed images or perform touch motions. The array substrate may be formed in a separate process such that the CF substrate and the array substrate can be bonded together.

In the array substrate, an organic layer and an anode layer may be formed under the cathode layer to form OLEDs, as shown in FIG. 1(b). The organic layer may also be referred as an organic unit. The anode layer may include a plurality of anode electrode each connected or correspond to an OLED. It should be noted that, FIG. 1 is merely for illustrative purposes and does not reflect the actual sizes and ratios of the elements. In some embodiments, the width of a RX may be a few microns.

The OLED in FIG. 1(b) may include a cathode layer, an anode layer (ITO) and an organic layer, formed on the substrate (e.g., glass substrate). The organic layer may include an electron transport layer (ETL), an emitting layer (EML), and a hole injection layer (HIL). The anode layer may be formed on a glass substrate, and the organic layer and the cathode layer may be stacked on the anode layer to form a sandwich-like structure. When in operation, a voltage is applied across the cathode and the anode such that a positive voltage is applied on the anode and a negative voltage is applied on the cathode. The ETL may facilitate the injection and transfer of electrons from the cathode to the organic layer. The HTL may facilitate the injection of holes from the anode to the organic layer. Holes and electrons may be combined as excitons and converted to light energy, e.g., visible light. The anode may be made of suitable metals with sufficient transparency such as indium tin oxide (ITO). The cathode may be made of suitable metals with sufficient transparency such as ITO or Mg:Al alloy. The ETL and the EML may be made of suitable organic materials such as Alq3 (tris(8-hydroxyquinoline) aluminum (III)), and the HTL may be made of suitable organic materials such as 1,3-Bis(triphenylsilyl)benzene. In FIG. 1, the minus sign represents the electrons. The positive sign represents the holes. The arrows represent the movement directions of the electrons and the holes.

Figure 2:
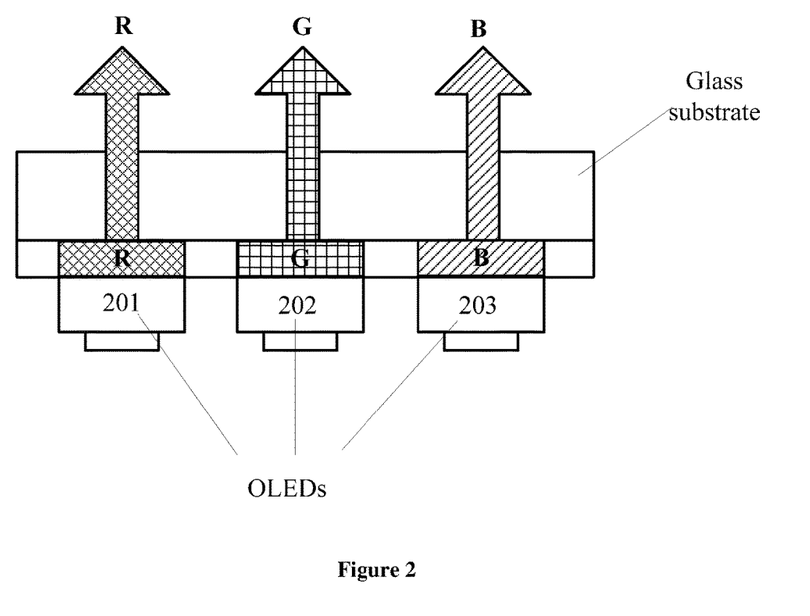
FIG. 2 illustrates exemplary color filters incorporated with OLEDs.

The operations of the CFs and OLEDs in the display panel may be further illustrated in FIG. 2. For example, as shown in FIGS. 2, 201, 202, and 203 may be white light OLEDs and CFs are placed between each OLED and the glass substrate. The glass substrate may correspond to the glass substrate in FIG. 1(a), and the user may be facing the glass substrate to watch the displayed images and perform touch motions. In FIG. 2, R represents a red CF, G represents a green CF, and B represents a blue CF. The CFs may be made of suitable color conversion materials (CCMs) such as organic dyes and may be formed by printing. White light emitted from OLEDs 201, 202, and 203 may transmit through each corresponding CF. Blue light (B), green light (G), and red light (R) may thus be obtained. The OLEDs 201, 202, and 203 may be included in a pixel for emitting light with various colors. It should be noted that the OLEDs 201, 202, and 203 and the related structures are merely for illustrative purposes of the relative positions between the OLEDs and CFs. Actual structure of the OLEDs may vary depending on different designs and applications.

A matrix of the white light OLEDs may be formed to display images in a display panel. The OLEDs may be driven by certain driving circuits. The cathode layer of the OLEDs, sufficiently transparent and thin, may be used to both provide current through the OLEDs for displaying images and to sense touch motions when a human finger or a conductive stylus touches the display panel.

Figure 3:
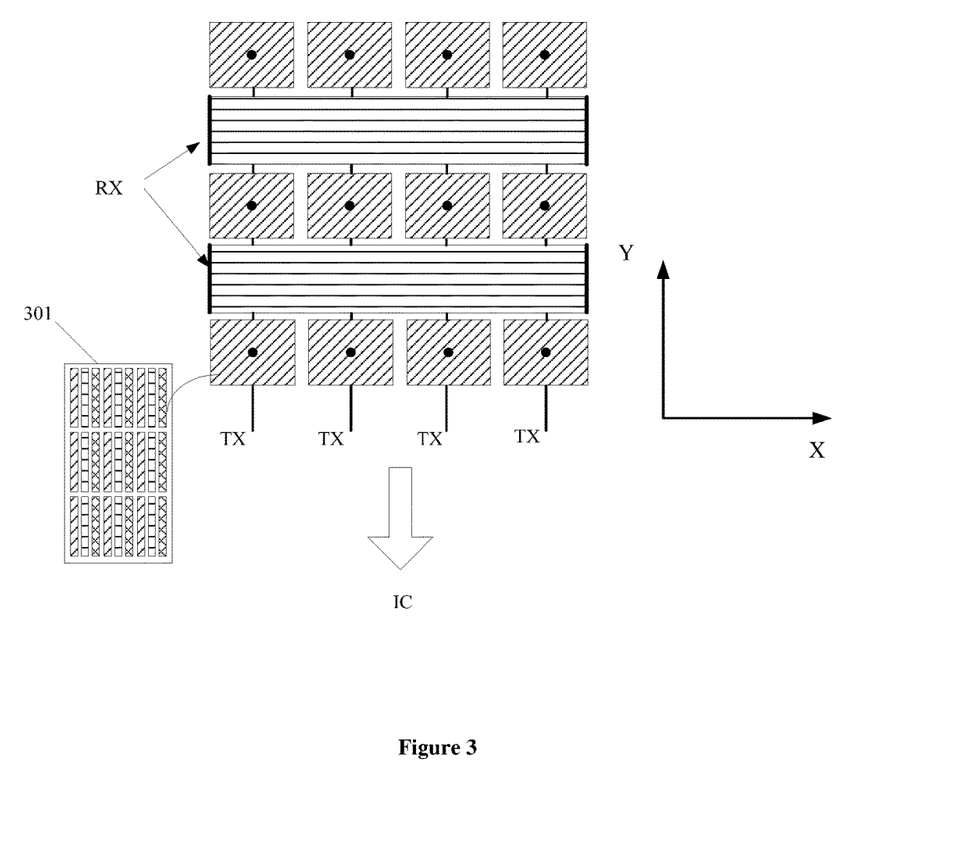
FIG. 3 illustrates the top view of an exemplary array substrate according to the embodiments of the present disclosure.

FIG. 3 illustrates a top view of the display panel. For illustrative purposes, only the touch receiving lines RXs and the cathode voltage lines TXs for a time-sharing operation are shown. The cathode layer may include two portions. One portion may include a plurality of cathode strips only for displaying images and the other portion may include a plurality of cathode pads for both displaying images and sensing touch motions. Each cathode pad may be a touch electrode. Each TX may be configured to apply time-sharing cathode voltages on the cathode pads in a row. A cathode pad may have a squared shape or a rectangular shape. For illustrative purposes, the cathode pads in the same row and connected to the same TX are marked with a black dot. The TXs may be parallel to each other along the Y direction (e.g., vertical direction) and may be formed in the array substrate, insulated from the RXs. As shown in FIG. 3, the cathode layer of the corresponding display panel can be divided into two portions.

The plurality of cathode strips may be aligned in parallel along the X direction (e.g., horizontal direction). Each cathode strip may be insulated from adjacent cathode pads or other adjacent cathode strips by appropriate insulating material or air. The cathode strips may be electrically connected together so that a common cathode voltage may be applied on the cathode strips. The RXs may be positioned along the X direction over the cathode strips, being insulated from the cathode strips, as shown in FIG. 1. Each RX may be connected to an integrated circuit (IC) for sensing and configuring the locations of touch motions.

The plurality of cathode pads may be aligned in parallel rows along the X direction. The cathode strips and rows of cathode pads may be arranged in an alternating manner such that each two adjacent cathode strips may be separated by a row of cathode pads; and each two adjacent rows of cathode pads may be separated by a cathode strip. The cathode pads may also be aligned in columns along the Y direction (e.g., the vertical direction). That is, two cathode pads, separated by a cathode strip along the Y direction, may be aligned in a column along the Y direction. A vertical distance between the central line (i.e., the line dividing a cathode strip into two equal portions along the Y direction) of one cathode strip and the central line of an adjacent cathode strip may be about 4 mm. The cathode pads may have same or different shapes. The cathode pads may have same or different sizes. The cathode strips may have same or different areas. In one embodiment, each cathode pad may have the same shape and area as other cathode pads, and each cathode strip may have the same shape and area as other cathode strips. It should be noted that the shapes and areas of cathode pads and cathode strips may be according to different designs and applications and should not be limited by the embodiments herein.

In one embodiment, the cathode pad may be of a rectangular shape, and the cathode strip may also be of a rectangular shape. In some embodiments, the cathode pad may be of a square shape, of a diamond shape, or other suitable shapes. In one embodiment, cathode pads may have the same shape. The area of each cathode pad in one row and/or in one column may be the same. In one embodiment, the area of each cathode pad on the display panel may be the same.

Each cathode pad may be electrically insulated from neighboring cathode pads in the same row and neighboring cathode strips. Cathode pads in the same column may be connected to one cathode voltage line TX for the time-sharing operation. Suitable insulating materials, such as resin or air, may be used to fill up the space between adjacent cathode pads and cathode strips. The space between each adjacent cathode pads and/or cathode strips may range from tens of micrometers to hundreds of micrometers according to different designs and applications.

An enlarged top view of a portion of the cathode layer 301 may be shown in FIG. 3. The portion of the cathode layer 301 may include a plurality of sub-pixels aligned in rows along the X direction and aligned in columns along the Y direction. A sub-pixel may correspond to any one of a red (R) CF, a green (G) CF, and a blue (B) CF. For example, a cathode pad 301 may correspond to CFs of RGB arranged repeatedly in a row along the X direction. Each column of sub-pixels may include sub-pixels of the same color. Each sub-pixel may be electrically insulated from other sub-pixels by a suitable insulating material such as $SiO_2$, air and/or resin. At least subpixels of three primary colors may form a pixel. When in operation, a cathode voltage and an anode voltage may be applied on each OLED such that the OLEDs may emit light. According to certain displaying signals, OLEDs of the entire display panel may emit light for displaying images. The configuration of the portion 301 may be used in the cathode pads and in the cathode strips.

It should be noted that, the cathode voltage lines TXs for the time-sharing operation may be arranged to be perpendicular to the touch signal lines RXs, and the orthographic projections of touch receive lines do not be overlapped with the touch cathode voltage lines. Thus, mutual capacitance between the RXs and the TXs may be greatly reduced, and touch performance may be improved.

Figure 4:
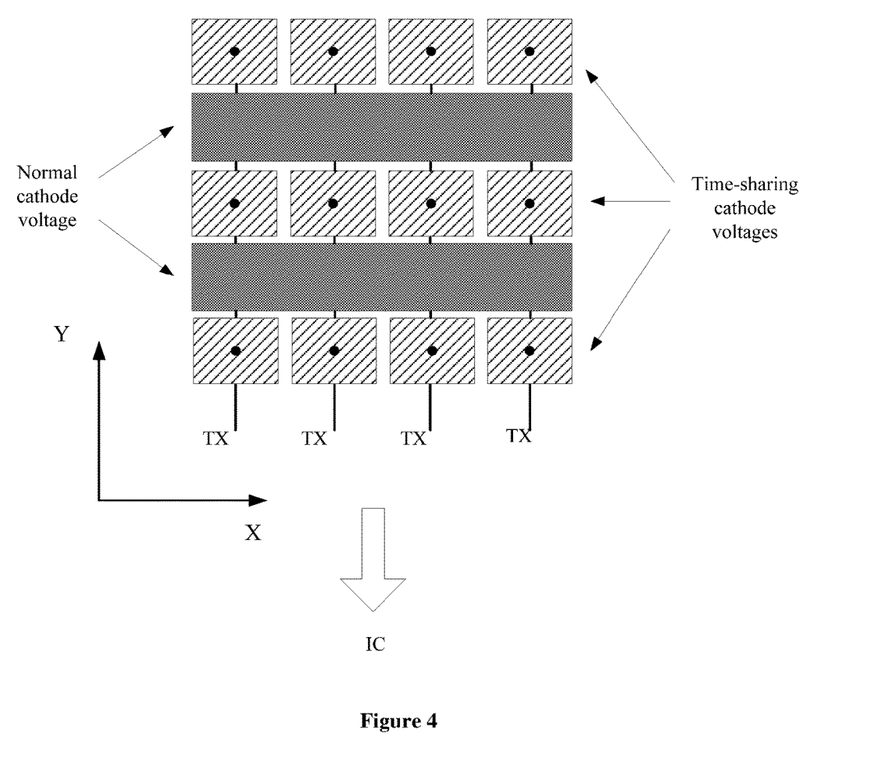
FIG. 4 illustrates the top view of an exemplary array substrate in the first embodiment of the present disclosure.
Figure 5:
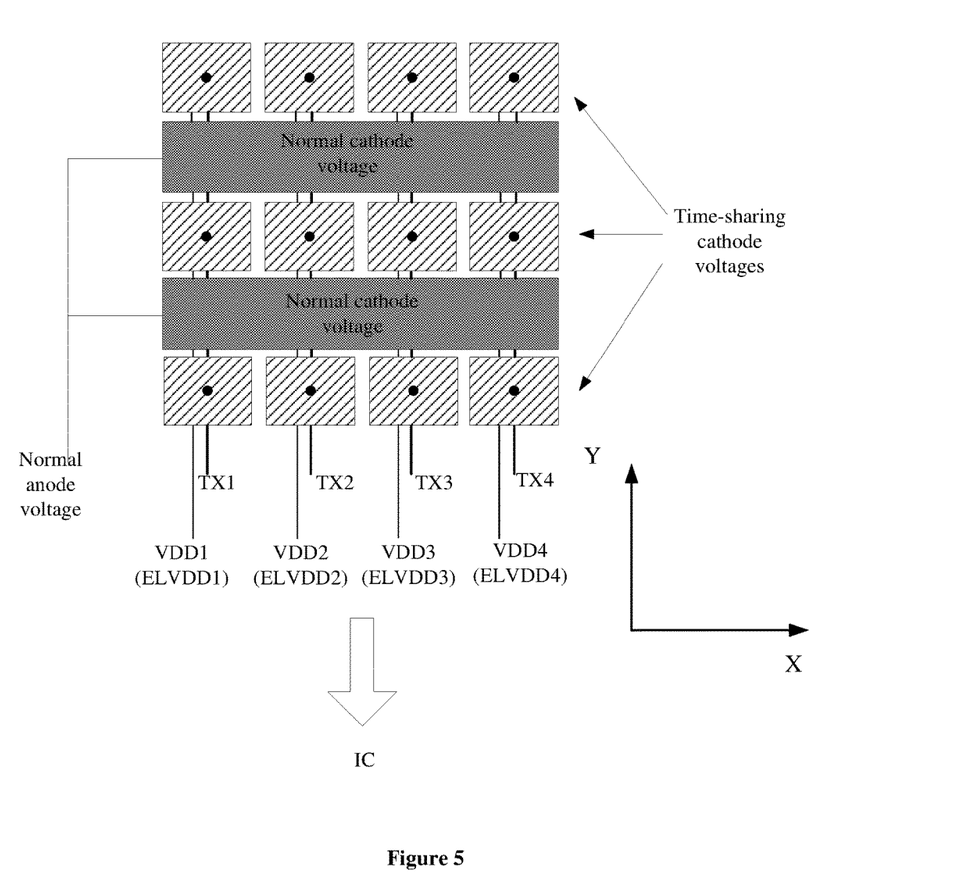
FIG. 5 illustrates the top view of an exemplary array substrate in the second embodiment of the present disclosure.

Embodiments of the present disclosure may be further illustrated in FIGS. 4 and 5.

FIG. 4 illustrates a first embodiment of the present disclosure. For viewing simplicity, only the cathode pads, the cathode strips, and the cathode voltage lines TXs for the time-sharing operation are shown. The display panel may be capable of displaying images and sensing touch motions. In the first embodiment, each frame may be divided into at least two modes or periods, a displaying mode/period and a touch-sensing mode/period.

In one frame, a normal cathode voltage may be applied on the cathode strips during the displaying mode and touch-sensing mode by a normal cathode voltage line (not shown in FIG. 4). A normal anode voltage, i.e., a driving voltage, may be applied on the anode layers corresponding to the cathode strips, where the anode layers may refer to the anode layers of the OLEDs corresponding to the cathode strips. During each frame, the cathode voltage (i.e., the normal cathode voltage) and the anode voltage (i.e., the normal anode voltage) applied on the OLEDs corresponding to the cathode strips may be stable, so that the OLEDs may emit light with a stable brightness.

In one frame, a normal cathode voltage may be applied on the cathode pads during the displaying mode by the TXs, and a touch cathode voltage may be applied on the cathode pads during the touch-sensing mode by the TXs. That is, the TXs may apply time-sharing cathode voltages on the cathode pads according to different modes of the display panel. A normal anode voltage, i.e., a driving voltage may be applied on the anode layers corresponding to the cathode pads, where the anode layers may refer to the anode layers of the OLEDs corresponding to the cathode pads. When a finger or a conductive stylus touches the touch screen of the display panel, the capacitance between the RXs and the TXs may be sensed by the RXs. The RXs may send signals reflecting the touch motion to the IC, and the IC may calculate the location or certain properties of the touch motion based on the signals.

Specifically, assuming the duration of one frame may be represented as $\Delta t$. In one frame $\Delta t$, the duration of a displaying mode may be $\Delta t1$, and the duration of a touch-sensing mode may be $\Delta t2$, where $\Delta t1+\Delta t2 \leq \Delta t$.

A normal cathode voltage, ELVSS, may be applied on cathode strips during $\Delta t1$ and $\Delta t2$ through a normal cathode voltage line (not shown). A normal anode voltage, ELVDD, may be applied on the anode layers corresponding to the cathode strips during $\Delta t1$ and $\Delta t2$ through a normal anode voltage line (not shown). Thus, the OLEDs corresponding to the cathode strips may have stable normal cathode voltage and stable normal anode voltage during each frame. The electric current flowing through the OLEDs may be stable so that the light emitted by the OLEDs may have stable intensity or brightness.

Different from the cathode strips, time-sharing cathode voltages may be applied on the cathode pads. In the displaying mode $\Delta t1$, the normal cathode voltage, ELVSS, may be applied on the cathode pads by the TXs. In the touch-sensing mode $\Delta t2$, the touch cathode voltage (ELVSS+$V_{touch}$) may be applied on the cathode pads by the TXs. $V_{touch}$ may be a wave-shaped touch driving signal, e.g., a square-wave signal. The touch cathode voltage may thus be a sum or superimposition of the normal cathode voltage ELVSS and the touch driving signal $V_{touch}$. The touch cathode voltage (ELVSS+$V_{touch}$) may have the same frequency as the touch driving signal $V_{touch}$. A normal anode voltage, ELVDD, may be applied on the anode layers corresponding to the cathode pads during $\Delta t1$ and $\Delta t2$ through a normal anode voltage line (not shown).

Thus, during the displaying mode $\Delta t1$, the OLEDs corresponding to the cathode pads may have stable normal cathode voltage and stable normal anode voltage so that the light emitted by the OLEDs may have stable intensity or brightness. In the touch-sensing mode, when a human finger or a conductive stylus touches the touch screen of the display panel, the capacitance between the RXs and the TXs may be sensed by the RXs. The RXs may send signals reflecting the touch motion to the IC, and the IC may calculate the location or certain properties of the touch motion based on the signals.

Thus, in each frame, the cathode layer of the display panel may be able to display images and sense touch motions. The mutual capacitance between the RXs and the TXs may be reduced because of the perpendicular arrangement. Touch performance of the display panel can be improved.

FIG. 5 illustrates a second embodiment of the present disclosure. For viewing simplicity, only the cathode pads, the cathode strips, the cathode voltage lines TXn for the time-sharing operation, and the touch anode voltage lines VDD1 to VDD4 are shown. For illustrative purposes, the normal anode voltage being corresponding to the cathode strips may only represent the normal anode voltage being applied on the anode layers corresponding to the cathode strips. The touch anode voltage lines VDD1 to VDD4 each being corresponding to a column of cathode pads may only represent the touch anode voltages ELVDDn (n=1, 2, 3, 4, etc.) applied by the touch anode voltage line VDDn (n=1, 2, 3, 4, etc.) on the anode layers corresponding to the column of cathode pads. The touch anode voltage ELVDDn (n=1, 2, 3, 4, etc.) may be equal to (ELVDD+$V_{touch}$), i.e., a superimposition of the normal anode voltage ELVDD and the touch driving signal $V_{touch}$. Thus, the touch anode voltage ELVDDn (n=1, 2, 3, 4, etc.) may be a wave-shaped voltage/signal and have the same frequency as the $V_{touch}$, which is the same frequency as the touch cathode voltage (ELVSS+$V_{touch}$).

In operation, TX1 may apply a first touch cathode voltage on the column of cathode pads; TX2 may apply a second touch cathode voltage on the column of cathode pads, and so on. The touch anode voltage line VDD1 may apply the touch anode voltage ELVDD1 on the anode layers corresponding to the column of cathode pads connected to TX1; the touch anode voltage line VDD2 may apply the touch anode voltage ELVDD2 on the anode layers corresponding to the column of cathode pads connected to TX2, and so on. The anode voltage lines VDDn and the TXs may both be formed in the array substrate. The anode voltage lines VDDn may be insulated to each other and the TXs.

Similar to the first embodiment, the operation of the display panel incorporating the cathode layer in FIG. 5 may also include at least a displaying mode and a touch-sensing mode.

In the displaying mode and the touch-sensing mode in one frame, a normal cathode voltage may be applied on the cathode strips during the displaying mode and touch-sensing mode by a normal cathode voltage line (not shown in FIG. 5). A normal anode voltage, i.e., a driving voltage, may be applied on the anode layers corresponding to the cathode strips, where the anode layers may refer to the anode layers of the OLEDs corresponding to the cathode strips. During each frame, the cathode voltage (i.e., the normal cathode voltage) and the anode voltage (i.e., the normal anode voltage) applied on the OLEDs corresponding to the cathode strips may be stable, so that the OLEDs may emit light with a stable brightness.

In the displaying mode of one frame, a normal cathode voltage may be applied on the cathode pads during the displaying mode by touch cathode voltage lines TX1 to TX4, and a normal anode voltage, i.e., a driving voltage may be applied on the anode layers corresponding to the cathode pads by the touch anode voltage lines VDDn (n=1, 2, 3, 4, etc), where the anode layers may refer to the anode layers of the OLEDs corresponding to the cathode pads. In the touch-sensing mode of one frame, a touch cathode voltage may be applied on each column of cathode pads during the touch-sensing mode by TX1 to TX4, and touch anode voltages ELVDDn (n=1, 2, 3, 4, etc) may be applied on the corresponding anode layers by the VDDn (n=1, 2, 3, 4, etc). That is, the TXn (n=1, 2, 3, 4, etc.) may apply time-sharing cathode voltages on the cathode pads according to different modes of the display panel. Also, the touch anode voltages ELVDDn (n=1, 2, 3, 4, etc) applied on the anode layers during the touch-sensing mode may compensate the cathode voltage change caused by a touch motion on the touch screen, and the current flowing through the OLEDs corresponding to the cathode pads during touch-sensing modes may be stable. The light emitted by the OLEDs may have stable brightness. Also, the parasitic capacitance between the cathode pads and the corresponding touch anode voltage lines can be greatly reduced. When a finger or a conductive stylus touches the touch screen of the display panel, the capacitance between the RXs and the TXn may be sensed by the RXs. The RXs may send signals reflecting the touch motion to the IC, and the IC may calculate the location or certain properties of the touch motion based on the received signals.

The IC may include a processor, a random access memory (RAM) unit, a read-only memory (ROM) unit, a storage unit, a display, an input/output interface unit, a database, and a communication interface. The communication interface may be used to receive signals sent by RXs or send signals to RXs to obtain data and/or control other functions of the display panel. The processor may be connected to the communication interface to calculate the received signals and/or execute other functions. The received and/or processed signals may be stored in the RAM, the ROM, and/or the storage unit for future use. The input/output interface unit may be used to receive commands or signals from the outside environment, e.g., a user. Other components may be added and certain devices may be removed without departing from the principles of the disclosed embodiments.

Specifically, assuming the duration of one frame may be represented as $\Delta t$. In one frame $\Delta t$, the duration of a displaying mode may be $\Delta t1$, and the duration of a touch-sensing mode may be $\Delta t2$, where $\Delta t1+\Delta t2 \leq \Delta t$.

In the displaying mode $\Delta t1$ and the touch-sensing mode $\Delta t2$, the normal cathode voltage ELVSS may be applied on the cathode strips through a normal cathode voltage line (not shown); and the normal anode voltage ELVDD may be applied on the anode layers corresponding to the cathode strips through a normal anode voltage line (not shown). Thus, the OLEDs corresponding to the cathode strips may have stable normal cathode voltage and stable normal anode voltage during each frame. The electric current flowing through the OLEDs may be stable so that the light emitted by the OLEDs may have stable intensity and/or brightness.

In the displaying mode $\Delta t1$, the normal cathode voltage ELVSS may be applied on the cathode pads by the TXn (n=1, 2, 3, 4, etc.), and the normal anode voltage ELVDD may be applied on the anode layers corresponding to the cathode pads by the VDDn (n=1, 2, 3, 4, etc.). In the touch-sensing mode $\Delta t2$, the touch cathode voltage (ELVSS+$V_{touch}$) may be applied on each column of cathode pads by the corresponding TXn (n=1, 2, 3, 4, etc.), and the touch anode voltage (ELVDD+$V_{touch}$) may be applied on the anode layers corresponding to the cathode pads. When a human finger or a conductive stylus touches the touch screen of the display panel, the capacitance between the RXs and the TXn may be sensed by the RXs. The RXs may send signals reflecting the touch motion to the IC, and the IC may calculate the location or certain properties of the touch motion based on the signals.

In the touch-sensing mode $\Delta t2$, because the touch cathode voltage (ELVSS±$V_{touch}$) and the touch anode voltage (ELVDD+$V_{touch}$), having the same frequency as the touch cathode voltage, are applied on the OLEDs corresponding to the cathode pads, the parasitic capacitance between the cathode pads and the corresponding anode layers may be greatly reduced.

Figure 12:
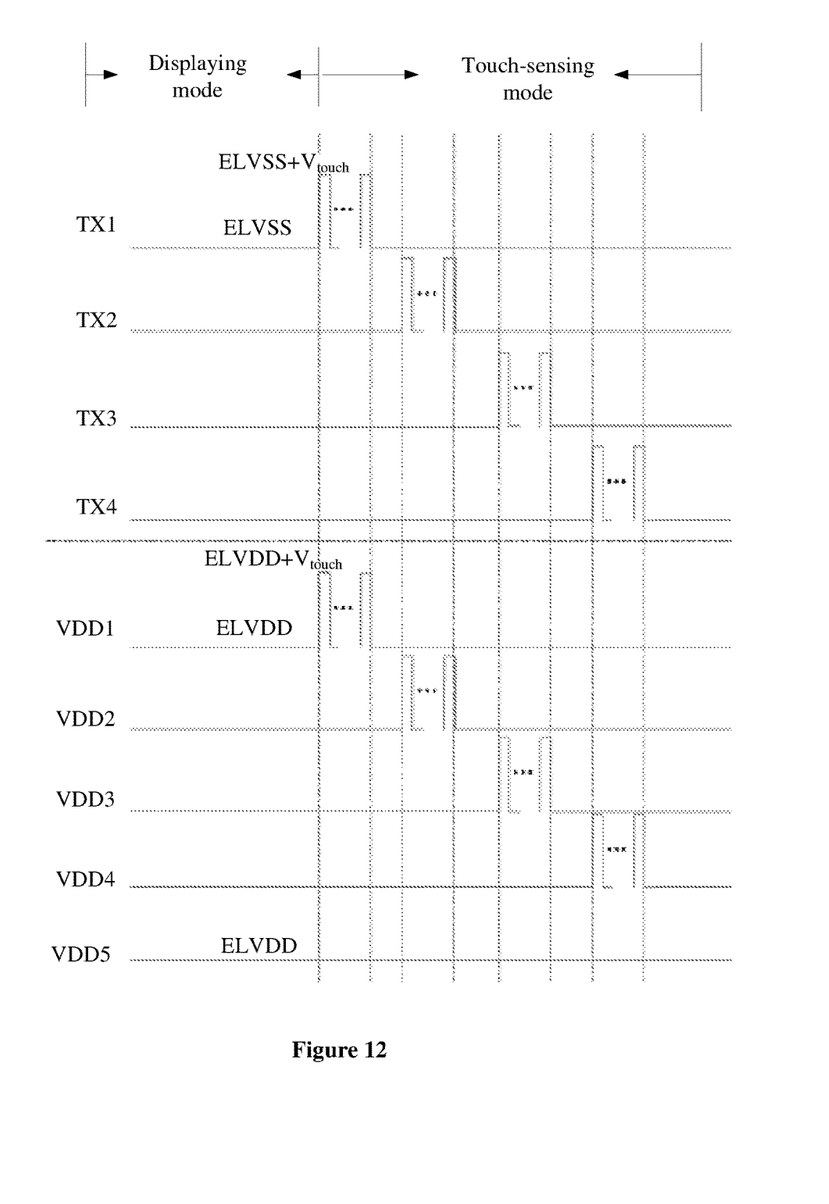
FIG. 12 illustrates timing charts of another exemplary operation process according to the embodiments of the present disclosure.

FIG. 12 illustrates a timing chart of the touch cathode voltage applied by the TXn (n=1, 2, 3, 4, etc.) and the touch anode voltage applied by the VDDn (n=1, 2, 3, 4, etc.). The IC and the driving TFTs of the display panel may control the scanning time of the cathode pads such that the touch cathode voltage (ELVSS+$V_{touch}$) and the corresponding touch anode voltage (ELVDD+$V_{touch}$) may be applied on the OLEDs according to a certain sequential manner.

For example, as shown in FIG. 12, in the displaying mode Δt1, the normal cathode voltage ELVSS may be applied on the cathode pads in each column by TX1 to TX4, and the normal anode voltage ELVDD may be applied on the anode layers corresponding to the columns of cathode pads by VDD1 to VDD4.

In the touch-sensing mode Δt2, the touch cathode voltage (ELVSS+$V_{touch}$) may first be applied by TX1 on the column of cathode pads connected to TX1, and the touch anode voltage (ELVDD+$V_{touch}$) may be applied by VDD1 on the anode layer corresponding to the column of cathode pads connected to TX1. The touch cathode voltage and the touch anode voltage applied on the OLEDs corresponding to the column of cathode pads connected to TX1 may have the same frequency, and the current flowing through the OLEDs may be stable. During this time the normal cathode voltage ELVSS may be applied on cathode pads in other columns (e.g., columns of cathode pads connected to TX2 to TX4), and the normal anode voltage ELVDD may be applied on the anode layers corresponding to those columns of cathode pads.

Further, the touch cathode voltage (ELVSS+$V_{touch}$) may first be applied by TX2 on the column of cathode pads connected to TX2, and the touch anode voltage (ELVDD+$V_{touch}$) may be applied by VDD2 on the anode layer corresponding to the column of cathode pads connected to TX2. The touch cathode voltage and the touch anode voltage applied on the OLEDs corresponding to the column of cathode pads connected to TX2 may have the same frequency, and the current flowing through the OLEDs may be stable. During this time the normal cathode voltage ELVSS may be applied on cathode pads in other columns (e.g., columns of cathode pads connected to TX1, TX3 and TX4), and the normal anode voltage ELVDD may be applied on the anode layers corresponding to those columns of cathode pads.

The touch cathode voltage (ELVSS+$V_{touch}$) and the touch anode voltage (ELVDD+$V_{touch}$) applied on the OLEDs corresponding to TX3 and TX4 may be according to the similar or same scanning sequence described above. For illustrative purposes, the present disclosure only shows the cathode pads connected to TX1 to TX4. In practice, more columns of cathode pads may be formed on the array substrate. The more columns of cathode pads may be arranged along the X direction before TX1 and/or after TX4. The scanning sequence and voltages applied on the OLEDs corresponding to the cathode pads of each column, e.g., applying the voltages on each column of cathode pads, may be referred to the description above and are not repeated herein. In FIG. 12, VDD5 may represent the normal anode voltage applied on the anode layers corresponding to the cathode strips. ELVSS and ELVDD may both be constant values.

Figure 11:
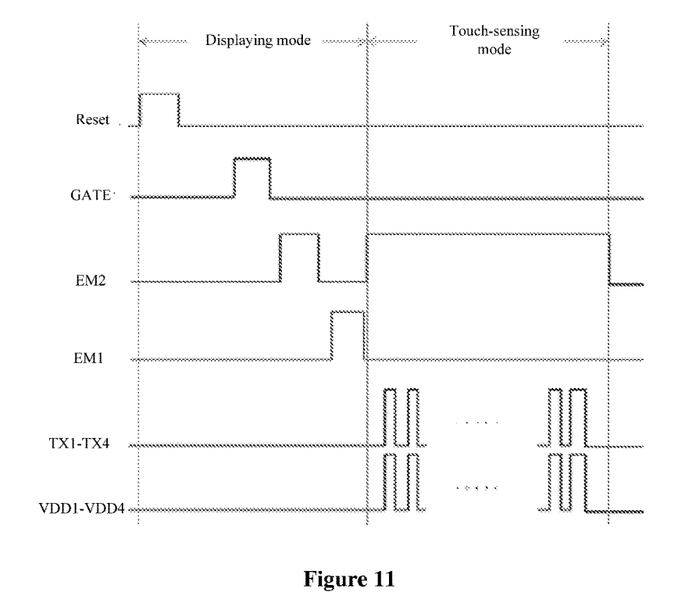
FIG. 11 illustrates timing charts of an exemplary operation process according to the embodiments of the present disclosure.

Referring to FIG. 12, because the touch cathode voltage applied by TX1 to TX4 may follow a sequential manner, in the touch-sensing mode, the touch cathode voltage applied by all the cathode voltage lines TXn (n=1, 2, 3, 4, etc.) may fill out the time span of a touch-sensing mode operation, as shown in FIG. 11. Similarly, the touch anode voltage applied by all the touch anode voltage lines VDDn (n=1, 2, 3, 4, etc.) may fill out the time span of a touch-sensing mode operation, as shown in FIG. 11.

By applying a touch anode voltage with the same frequency as the touch cathode voltage on the OLEDs during each touch-sensing mode, the parasitic capacitance between the cathode layer, i.e., the cathode pads, and the corresponding anode voltage lines may be greatly reduced. Delays of touch sensing can be reduced and touch performance of the display panel can be improved.

The IC may be configured to combine or superimpose the touch driving signal with the normal cathode voltage ELVSS and the normal anode voltage ELVDD to generate the wave-shaped touch cathode voltage (ELVSS+$V_{touch}$) and the touch anode voltage (ELVDD+$V_{touch}$). According to the description above, the IC may also be configured to apply the voltages on the OLEDs according to certain timing sequence, as described above.

It should be noted that, the cathode voltage lines TX1 to TX4, and the touch anode voltage lines VDDn (n=1, 2, 3, 4, etc.) in the figures and the related descriptions are only for illustrative purposes. The number of cathode voltage lines TXn and touch anode voltage lines VDDn may be change according to various applications. Details of the operations for circuits with a different number of cathode voltage lines and/or touch anode voltage lines are similar to the operations and configurations disclosed and are thus not repeated herein.

Figure 6:
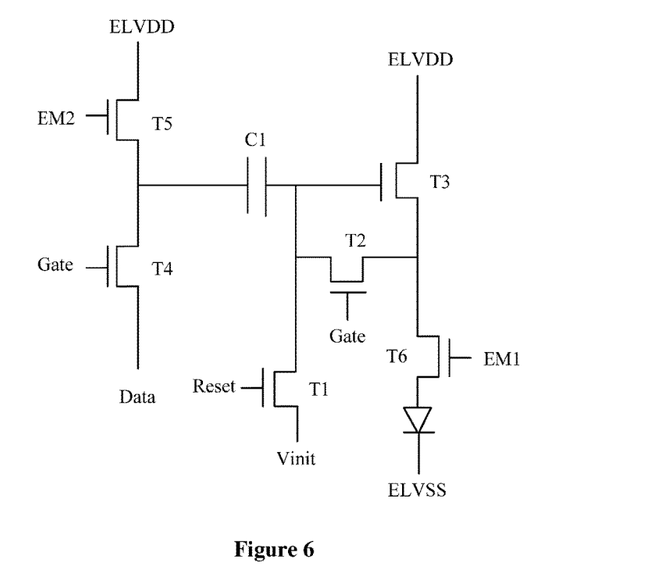
FIGS. 6-10 illustrate the operation of an exemplary circuit of the array substrate.

Another aspect of the present disclosure provides a method for driving the array substrate. The method may be illustrated by an exemplary operation of an OLED in the array substrate. FIG. 6 illustrates an exemplary driving circuit of an OLED. FIGS. 7 to 10 illustrate various stages of the exemplary operational process.

As shown in FIG. 6, an exemplary driving circuit may include transistors T1 to T6, a capacitor C1, and an OLED. The timing of the driving circuit may be controlled by control signals Gate, Reset, Data, EM1, and EM2. ELVDD, ELVSS, and $V_{init}$ may represent different types of voltages. Transistors T1 to T6 may be TFTs As shown in FIG. 6, the drain of T5 may be connected to the normal anode voltage ELVDD and the source of T5 may be connected to the drain of T4. The source of T4 may be connected to a data line Data. Control signal EM2 may be connected to the gate of T5 and control signal Gate may be connected to the gate of T4. The source of T5 and the drain of T4 may be connected to a first terminal of the capacitor C1. A second terminal of the capacitor C1 may be connected to the gate of T3, the source of T2, and the drain of T1. The source of T1 may be connected to an initial voltage $V_{init}$. The control signal Reset may be connected to the gate of T1. The control signal Gate may be applied on the gate of T2, and the drain of T2 may be connected to the source of T3. The drain of T3 may be connected to the normal anode voltage ELVDD. The drain of T2 and the source of T3 may be connected to the drain of the driving transistor T6. The source of T6 may be connected to the anode of the OLED and the gate of T6 may be connected to the control signal EM1. The cathode of the OLED may be connected to the normal cathode voltage ELVSS. The OLED in FIG. 6 may be any OLED in a display panel. In one embodiment, the voltage provided by $V_{init}$ may be 0V.

In one embodiment, the OLED in FIG. 6 may be an OLED corresponding to a cathode pad. In operation, the normal cathode voltage ELVSS and the normal anode voltage ELVDD may be applied on the OLED during the displaying mode. A wave-shaped touch driving signal $V_{touch}$ may be combined with the normal cathode voltage ELVSS in the touch-sensing mode. In one embodiment, the wave-shaped touch driving signal $V_{touch}$ may be combined with the normal cathode voltage ELVSS and the normal anode voltage ELVDD respectively during the touch-sensing mode. For illustrative purposes, only the normal cathode voltage and the normal anode voltage are shown in the figures.

In one embodiment, the TFTs (i.e., T1 to T6) may be N-type transistors. In certain other embodiments, the TFTs may be P-type transistors. Configurations and operations of the driving circuit using P-type TFTs consistent with the embodiments of the present disclosure are known to those skilled in the art and are thus omitted herein.

FIGS. 7 to 10 further illustrate the operational stages of an OLED corresponding to a cathode pad of a display panel. FIG. 11 illustrates the timing chart of each operational stage. The operations may include four stages, i.e., a resetting stage, a charging stage, a compensating stage, and an illuminating stage. The resetting stage, the charging stage, and the compensating stage may be included in the displaying mode. The touch-sensing mode often occurs in the illuminating stage. That is, the display panel may be operated in displaying mode before the touch-sensing mode in a frame.

Figure 7:
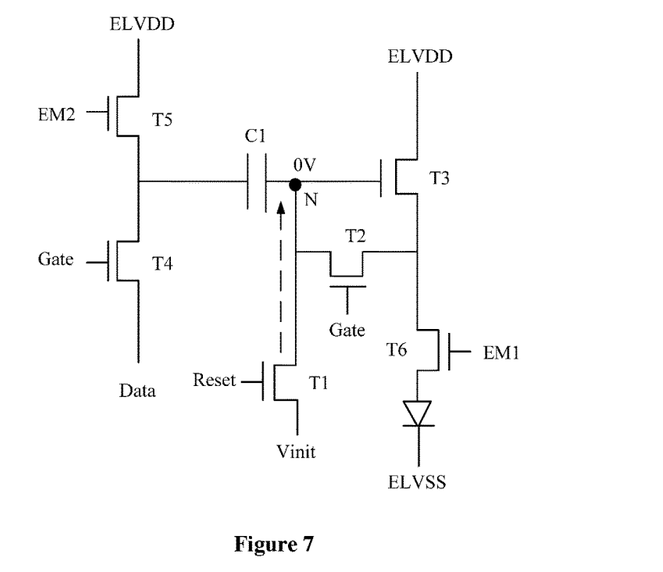

As shown in FIGS. 7 and 11, in the resetting stage, the Reset signal may apply a high voltage on the gate of T1 to turn on T1 such that the voltage at point N may be reset to 0V, same as the voltage of $V_{init}$. T2 to T6 may be turned off.

Figure 8:
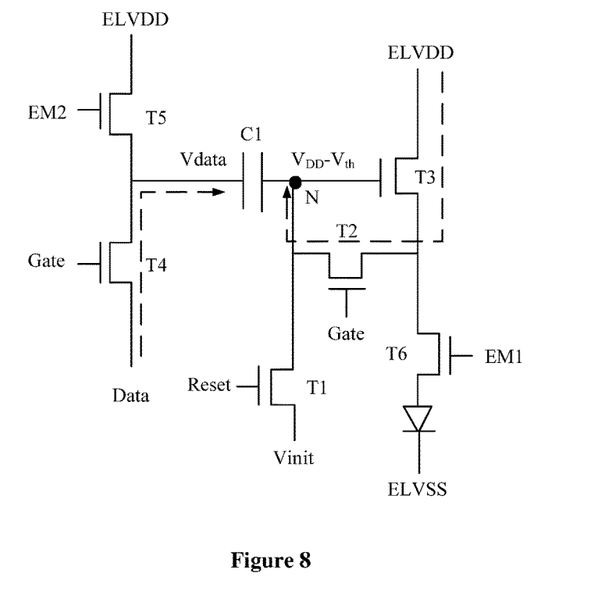

As shown in FIGS. 8 and 11, in the charging stage, the Gate signal may apply a high voltage on the gates of T2, T3, and T4 to turn on T2, T3, and T1. T5, and T6 may be turned off. Data line may output a high voltage so that the voltage at the first terminal of C1 may be $V_{data}$. The voltage at the second terminal of C1 (i.e., point N) may be $(V_{DD}-V_{th})$. $V_{DD}$ may be the normal anode voltage provided by the corresponding touch anode voltage line ELVDD, and $V_{th}$ may be the threshold voltage of T2.

Figure 9:
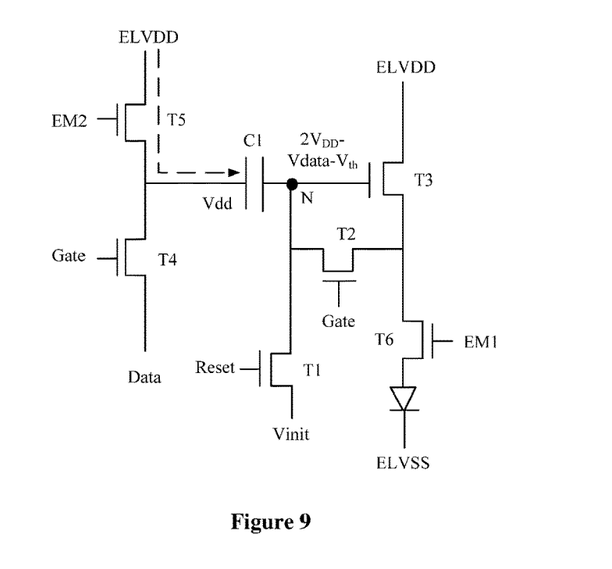

As shown in FIGS. 9 and 11, in the compensating stage, EM2 may apply a high voltage on the gate of T5 to turn on T5. T1 to T4 and T6 may be turned off. The voltage at the first terminal of C1 may be $V_{DD}$ and the second terminal of C1 (i.e., point N) may be $(2V_{DD}-V_{data}-V_{th})$.

Figure 10:
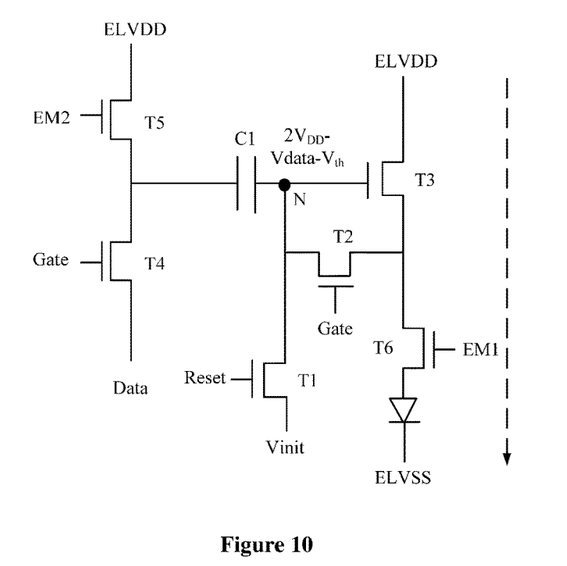

As shown in FIGS. 10 and 11, in the illuminating stage, EM1 may apply a high voltage on the gate of T6 to turn on T6. T3 can also be turned on. T1, T2, T4, and T5 may be turned off. Driving current (shown as the arrow) may flow through the OLED and the OLED may emit light. The driving current $I_{OLED}$ may be represented as $I_{OLED}=\frac{1}{2}K(V_{GS}-V_{DD}-V_{data}-V_{th})^2=\frac{1}{2}K[V_{DD}+V_{data}]^2$. In this equation, K may represent a constant parameter reflecting certain manufacturing and structural features of the driving transistor T6; $V_{GS}$ may represent the gate-source voltage of T6; and $V_{th}$ may represent the threshold voltage of T6. In this equation, the threshold voltage of T6, $V_{th}$, has been eliminated from the equation to ensure the driving current flowing through the OLED is independent of $V_{th}$, and thus the OLED may emit light in a more stable manner.

The touch-sensing mode may occur in the illuminating stage, i.e., after the OLED starts emitting light. In the touch-sensing mode, the touch cathode voltage (ELVSS+$V_{touch}$) may be applied on the cathode of the OLED. The touch anode voltage ($V_{DD}+V_{touch}$) may be applied through T3 and T5 on the C1. Accordingly, the voltage on the second terminal of C1 may also have the same frequency as the touch driving signal $V_{touch}$. Thus, the anode of the OLED and cathode of the OLED are both driven by $V_{touch}$ and thus have the same frequency, so that $V_{GS}$ of T3 and T6 may not change. Thus, the current flowing through the OLED may stay stable during the touch-sensing mode, and the parasitic capacitance between the cathode pad and the corresponding anode layer may be greatly reduced.

As shown in FIG. 11, in the displaying mode, the cathode voltage line TX may apply a normal cathode voltage ELVSS on the cathode of the OLED. The normal anode voltage ELVDD (with a value of $V_{DD}$) may be applied on the drain of T3. The OLED may thus emit light normally.

In the touch-sensing mode, EM2 may maintain a high voltage to ensure T5 is on. The IC may combine the touch driving signal $V_{touch}$ with the normal cathode voltage ELVSS to obtain a wave-shaped touch cathode voltage, e.g., a square-wave voltage signal, and apply the square-wave touch cathode voltage on the cathode of the OLED. To reduce the parasitic capacitance between the cathode and anode of the OLED and ensure the OLED emit light with desired brightness level and stability, the IC may also combine the touch driving signal $V_{touch}$ with the normal anode voltage $V_{DD}$ to obtain a wave-shaped touch anode voltage with the same frequency as the touch cathode voltage. In one embodiment, the touch anode voltage may also be a square-wave voltage signal. Thus, the driving current flowing through the OLED may be stable and the brightness stability of the OLED is less susceptible to touch motions when the display panel is displaying images. Because the touch cathode voltage (ELVSS+$V_{touch}$) and the touch anode voltage ($V_{DD}+V_{touch}$) applied the OLED have the same frequency, the parasitic capacitance between the cathode and the anode of the OLED can be greatly reduced. Touch performance of the display panel can be improved.

For an OLED corresponding to a cathode strip, a normal cathode voltage may be applied on the cathode of the OLED throughout the resetting stage, the charging stage, the compensating stage, and the illuminating stage. That is, in the touch-sensing mode, the normal cathode voltage may be applied on the cathode of an OLED corresponding to a cathode strip, and the normal anode voltage may be applied on the anode of an OLED corresponding to a cathode strip. The current flowing through the OLED may be stable, and OLED may emit light with stable and unimpaired intensity.

Embodiments of the present disclosure may provide an in-cell touch display panel incorporating an array substrate according to the present disclosure. By using the disclosed array substrate, the display panel may be able to display images with desired brightness level and improved display stability when a touch motion. Such display panel may also have reduced parasitic capacitance between the cathode electrodes and touch anode voltage lines, and reduced mutual capacitance between signal lines. Touch performance may be improved.

Embodiments of the present disclosure may provide a display apparatus incorporating the display panel provided by the present disclosure. Exemplarily, the display apparatus according to the embodiments of the present disclosure can be used in any product with display functions such as a display panel, a television, an LCD, an OLED, an electronic paper, a digital photo frame, a mobile phone and a tablet computer.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate for an organic light-emitting diode (OLED) display panel, comprising:
   a substrate;
   a thin film transistor (TFT) layer comprising a plurality of TFTs;
   an anode layer comprising a plurality of anode electrodes;
   an organic layer comprising a plurality of organic units corresponding to anode electrodes; and
   a cathode layer comprising a plurality of touch electrodes for a time-sharing operation,
   wherein:
      each touch electrode corresponds to a portion of the plurality of organic units, the plurality of the touch electrodes being arranged to be applied with a normal cathode voltage in a displaying period and to be applied with a touch cathode voltage in a touch-sensing period, and
      an integrated circuit (IC) is connected to touch cathode lines and the TFT layer, the IC being configured to combine a discrete driving signal with the normal cathode voltage to generate the touch cathode voltage and combine the discrete driving signal with a normal anode voltage to generate a touch anode voltage.

2. The array substrate according to claim 1, wherein the cathode layer further includes a plurality of normal cathode electrodes corresponding to the plurality of organic units, the normal cathode voltage being applied on the plurality of normal cathode electrodes.

3. The array substrate according to claim 1, wherein:
   at least one of the displaying periods and at least one of the touch-sensing periods are included in one frame,
   the array substrate is operated in the displaying period for displaying images, and
   the array substrate is operated in the touch-sensing period for displaying images and sensing touch motions.

4. The array substrate according to claim 1, wherein the touch electrodes are aligned in columns, each touch electrode being connected to one of the touch cathode lines, and the touch electrodes being insulated from one another and aligned along a first direction.

5. The array substrate according to claim 2, wherein the normal cathode electrodes are aligned in strips, each normal cathode electrode being connected to a normal cathode line.

6. The array substrate according to claim 3, wherein in the displaying period of the time-sharing operation, the normal anode voltage is applied on the anode electrodes of the organic units corresponding to the touch electrodes, and the normal cathode voltage is applied on the touch electrodes by touch cathode voltage lines.

7. The array substrate according to claim 3, wherein in the touch-sensing period of the time-sharing operation, the normal anode voltage is applied on the anode electrodes of OLEDs corresponding to the touch electrodes, and the touch cathode voltage is applied on the touch electrodes by touch cathode voltage lines.

8. The array substrate according to claim 3, wherein in the touch-sensing period of the time-sharing operation, the touch anode voltage is applied on the anode electrodes of the organic units corresponding to the touch electrodes, and the touch cathode voltage is applied on the touch electrodes by touch cathode voltage lines, the touch cathode voltage and the touch anode voltage being discrete signals.

9. The array substrate according to claim 2, wherein in the time-sharing operation, the normal anode voltage is applied on the anode electrodes of the organic units corresponding to the normal cathode electrodes, and the normal cathode voltage is applied on the normal cathode electrodes.

10. The array substrate according to claim 8, wherein the touch cathode voltage and the touch anode voltage have same frequencies.

11. The display panel according to claim 1, further including touch receiving lines distributed on a color filter substrate along a second direction for sensing touch motions, the touch receiving lines being insulated from the normal cathode electrodes, the second direction being perpendicular to the first direction, and the orthographic projections of touch receive lines not being overlapped with the touch cathode voltage lines.

12. A method for driving an array substrate having a substrate, a thin film transistor (TFT) layer with a plurality of TFTs, an anode layer with a plurality of anode electrodes each corresponding to at least an organic unit, a plurality of organic units, and a cathode layer with a plurality of touch electrodes for a time-sharing operation, each touch electrode being corresponding to a portion of the plurality of organic units and the touch electrodes being arranged in columns, comprising:
   applying a normal cathode voltage on the touch electrodes in a displaying period of the time-sharing operation;
   applying a touch cathode voltage on the touch electrodes in a touch-sensing period of the time-sharing operation, wherein the normal cathode voltage has a constant voltage value and the touch cathode has a discrete voltage value;
   operating the array substrate in the displaying period for displaying images and operating the array substrate in the touch-sensing period for displaying images and sensing touch motions, wherein at least one of the displaying periods and at least one of the touch-sending periods are included in one frame;
   in the touch-sensing period of the time-sharing operation, applying a touch anode voltage on the anode electrodes of the organic units corresponding to the touch electrodes and applying the touch cathode voltage on the touch electrodes by touch cathode voltage lines, wherein the touch cathode voltage and the touch anode voltage are discrete signals with same frequencies; and
   applying the touch cathode voltage on each column of the touch electrodes based on a scanning sequence and applying the touch anode voltage on the anode electrodes of the organic units corresponding to the touch electrodes based on a same scanning sequence.

13. The method according to claim 12, wherein the cathode layer further includes a plurality of normal cathode electrodes corresponding to the plurality of the organic units and the method further comprises applying the normal cathode voltage on the plurality of normal cathode electrodes.

14. The method according to claim 12, further comprising, in the displaying period of the time-sharing operation, applying a normal anode voltage on the anode electrodes of the organic units corresponding to the touch electrodes, and applying the normal cathode voltage on the touch electrodes by the touch cathode voltage lines.

15. The method according to claim 12, further comprising, in the touch-sensing period of the time-sharing operation, applying a normal anode voltage on the anode electrodes of OLEDs corresponding to the touch electrodes, and applying the touch cathode voltage on the touch electrodes by the touch cathode voltage lines.

16. An array substrate for an organic light-emitting diode (OLED) display panel, comprising:

a substrate;

a thin film transistor (TFT) layer comprising a plurality of TFTs;

an anode layer comprising a plurality of anode electrodes;

an organic layer comprising a plurality of organic units corresponding to anode electrodes; and a cathode layer comprising a plurality of touch electrodes for a time-sharing operation, wherein:

each touch electrode corresponds to a portion of the plurality of organic units, the plurality of the touch electrodes being arranged to be applied with a normal cathode voltage in a displaying period and to be applied with a touch cathode voltage in a touch-sensing period,     at least one of the displaying periods and at least one of the touch-sensing periods are included in one frame,     the array substrate is operated in the displaying period for displaying images,     the array substrate is operated in the touch-sensing period for displaying images and sensing touch motions,     in the touch-sensing period of the time-sharing operation, a touch anode voltage is applied on the anode electrodes of the organic units corresponding to the touch electrodes, and the touch cathode voltage is applied on the touch electrodes by touch cathode voltage lines, the touch cathode voltage and the touch anode voltage being discrete signals, and     the touch cathode voltage and the touch anode voltage have same frequencies.

\* \* \* \* \*